United States Patent [19]
Oh

[11] Patent Number: 5,838,173
[45] Date of Patent: Nov. 17, 1998

[54] DEVICE AND METHOD FOR DETECTING A LOW VOLTAGE IN A SYSTEM

[75] Inventor: Hyung Seog Oh, Chungcheoungbuk-do, Rep. of Korea

[73] Assignee: LG Semicon Co., Ltd., Chungcheongbuk-do, Rep. of Korea

[21] Appl. No.: 866,239

[22] Filed: May 30, 1997

[30] Foreign Application Priority Data

Oct. 24, 1996 [KR] Rep. of Korea ............... 1996/48007

[51] Int. Cl.⁶ ............................................. H03K 5/22
[52] U.S. Cl. ............................................. 327/77; 327/88
[58] Field of Search .................. 327/77, 80, 81, 327/88, 89, 560–563

[56] References Cited

U.S. PATENT DOCUMENTS

| | | | |
|---|---|---|---|
| 3,946,302 | 3/1976 | Kovalick et al. | 327/77 |
| 4,301,380 | 11/1981 | Thomas | 340/636 |
| 5,196,833 | 3/1993 | Kemp | 340/663 |
| 5,274,337 | 12/1993 | Young et al. | 327/77 |
| 5,386,152 | 1/1995 | Naraki | 327/78 |
| 5,387,882 | 2/1995 | Schoofs | 327/77 |

Primary Examiner—Toan Tran

[57] ABSTRACT

In a system, a low-voltage detecting circuit includes an oscillating section for outputting a rectangular wave proportional to a supply voltage according to a control signal selected by the user and produced by a micro-controller unit, and a low-voltage detecting signal generator for counting the number of waves present in the rectangular waveform and comparing the count value with a reference value preset by the user to produce a detection signal for detecting a voltage drop in the system.

28 Claims, 3 Drawing Sheets

F I G.2
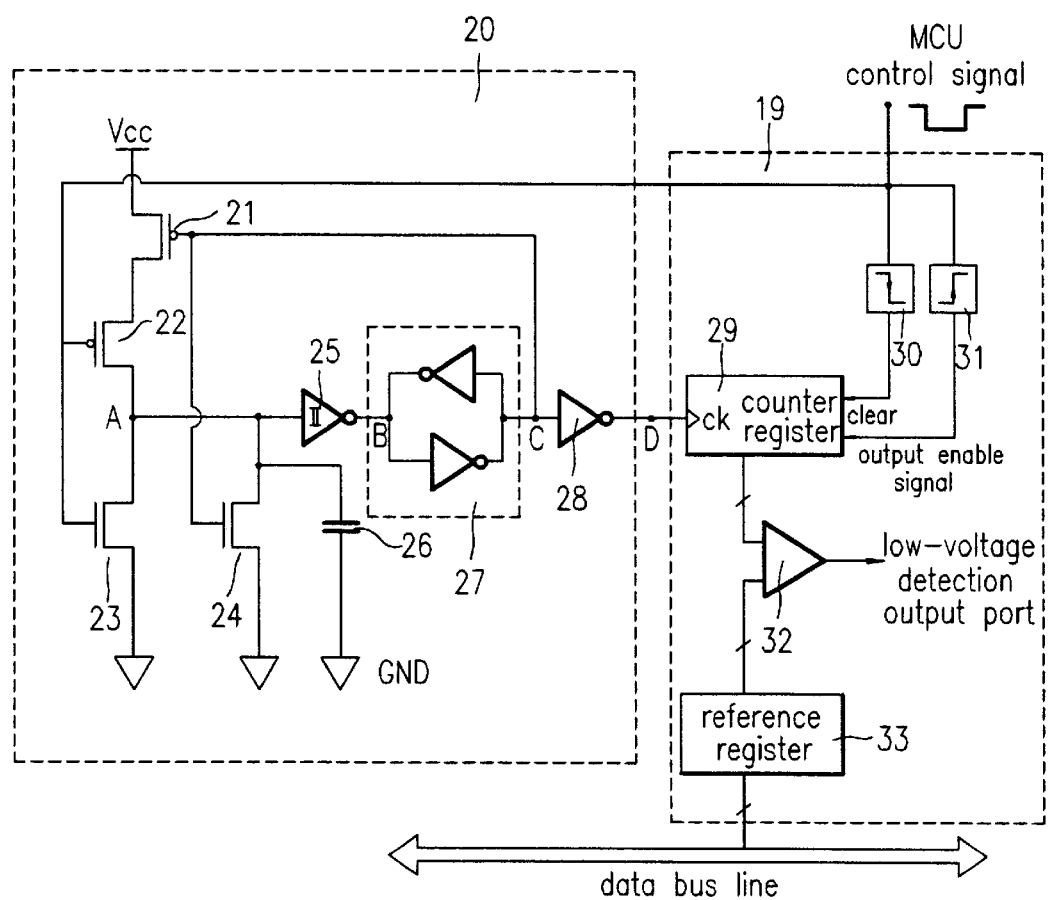

DEVICE AND METHOD FOR DETECTING A LOW VOLTAGE IN A SYSTEM

BACKGROUND OF THE INVENTION

1. Field of the Invention

The present invention relates to a device and method for detecting a low voltage in a system and more particularly, to a low-voltage detecting circuit which generates a waveform corresponding to the level of a supply voltage applied to the circuit and which compares the number of waves present in the waveform with a reference value to output a detection signal.

2. Discussion of the Related Art

A conventional low-voltage detecting circuit is used in various electronic systems to detect whether a given voltage applied to the conventional low-voltage detecting circuit is lower than a rated voltage of the corresponding system.

The conventional low-voltage detecting circuit is described below with reference to FIG. 1 showing a circuit diagram of a conventional low-voltage detecting circuit.

As shown in FIG. 1, the conventional low-voltage detecting circuit includes a low-voltage detecting section 1, first and second inverters 5 and 7, and a capacitor 6.

The low-voltage detecting section 1 includes a P-type metal oxide semiconductor (PMOS) transistor 2 and a pair of N-type metal oxide semiconductor (NMOS) transistors 3 and 4. The gate electrode of the PMOS transistor 2 is grounded, whereas its source electrode is connected to a supply voltage Vcc. The PMOS transistor 2 is turned on at all times. The NMOS transistors 3 and 4 are coupled in a diode configuration in series with the drain electrode of the PMOS transistor 2.

The first inverter 5 inverts an output signal from the drain electrode of the PMOS transistor 2, and outputs the inverted signal to the second inverter 7. The output terminal of the first inverter 5 is also connected to the capacitor 6. One electrode of the capacitor 6 is grounded to store the input signal. The second inverter 7 inverts its input signal and outputs a detection signal to the low-voltage detection output port.

The following description relates to the operation of the conventional low-voltage detecting circuit shown in FIG. 1.

The PMOS transistor 2 is turned on at all times. If the supply voltage Vcc is higher than a threshold voltage (2V) of the NMOS transistors 3 and 4, the NMOS transistors 3 and 4 are turned on to cause potentials at nodes X and Y to be "low" and "high", respectively. The high level signal at node Y is converted into a low level signal by the second inverter 7. As a result, a "low" detection signal which indicates that the supply voltage is not 10 w, is output to the low-voltage detection output port.

If the supply voltage Vcc is lower than the threshold voltage (2V) of the transistors 3 and 4, the NMOS transistors 3 and 4 are turned off to cause the potentials at nodes X and Y to be "high" and "low", respectively. The low level signal at node Y is inverted by the second converter 7. As a result, a "high" detection signal which indicates that the supply voltage is low is output to the output port.

The conventional low-voltage detecting circuit performs a low voltage detection by utilizing the threshold voltage of the NMOS transistors. Therefore, the conventional low-voltage detecting circuit has the following problems.

If the threshold voltage of the NMOS transistors is varied during fabrication, the detection result is varied and becomes inaccurate.

Furthermore, because an electrical current always flows into the PMOS transistor and NMOS transistors of the conventional detecting circuit, it cannot be used in a system operating from a dry cell.

Moreover, instantaneous supply voltage swing may cause an output variation at the low-voltage detection output port. Thus, the conventional low-voltage detecting circuit is susceptible to malfunctions and system failures.

SUMMARY OF THE INVENTION

Accordingly, the present invention is directed to a low-voltage detecting circuit and a method of detecting a low voltage in a system, which substantially obviate one or more of the problems due to limitations and disadvantages of the related art.

An object of the present invention is to provide a low-voltage detecting circuit in which the transconductance of transistors is varied depending on a voltage applied to the circuit.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, the low-voltage detecting circuit according to the embodiments of the present invention includes a low-voltage detecting circuit having an oscillating section for outputting a rectangular waveform proportional to a supply voltage according to a control signal, the control signal being selected by a user and produced from a micro-controller unit; and a low-voltage detecting signal generator for counting the number of cycles in the rectangular waveform and comparing the count value with a reference value preset by the user to produce a detection signal under control of the control signal.

The oscillating section includes a first P-type metal oxide semiconductor (PMOS) transistor having one electrode connected to the supply voltage; a second PMOS transistor coupled in series with the first PMOS transistor; a first N-type metal oxide semiconductor (NMOS) transistor having one electrode connected to the second PMOS transistor and to an output terminal in common, and another electrode connected to the ground; a second NMOS transistor having one electrode coupled in parallel with the output terminal of the first NMOS transistor, and another electrode connected to the ground; a capacitor connected to the output terminal and the second NMOS transistor in common; a schmitt trigger connected to the output terminal for rectifying a signal produced by charging or discharging the capacitor; a latch for storing and producing an output of the schmitt trigger; and an inverter for inverting an output of the latch.

The low-voltage detecting signal generator includes a counter register for counting and storing the output waveform's cycles; a falling edge detecting section for detecting falling edges of the control signal from the micro-controller unit and inputting a clear signal to the counter register based on its detection; a rising edge detecting section for detecting rising edges of the control signal from the micro-controller unit and outputting a value latched by the counter register based on its detection; a reference register for storing a predetermined reference value input through a data bus line; and a comparator for comparing an output value of the counter register with that of the reference register and producing a low-voltage detecting signal based on the comparison result.

It is to be understood that both the foregoing general description and the following detailed description are exemplary and explanatory and are intended to provide further explanation of the invention as claimed.

Briefly described, the preset invention is directed to a low-voltage detecting circuit including oscillating means for generating a waveform proportional to a supply voltage according to a control signal input thereto; and low-voltage detecting signal generating means for generating a detection signal based on the waveform generated from the oscillating means for indicating when the supply voltage is low.

Furthermore, the present invention is directed to a method of detecting a low voltage in a system including the steps of generating a waveform proportional to a supply voltage according to a control signal generated by a control unit; counting a number of waves present in the waveform; comparing the count value with a reference value; and outputting a detection signal for indicating when the supply voltage is low based on the comparison result.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings, wherein:

FIG. 2 is a circuit diagram of a low-voltage detecting circuit in accordance with the embodiments of the present invention.

DETAILED DESCRIPTION OF PREFERRED EMBODIMENTS

Reference will now be made in detail to the preferred embodiments of the present invention, examples of which are illustrated in the accompanying drawings.

Figure 1:
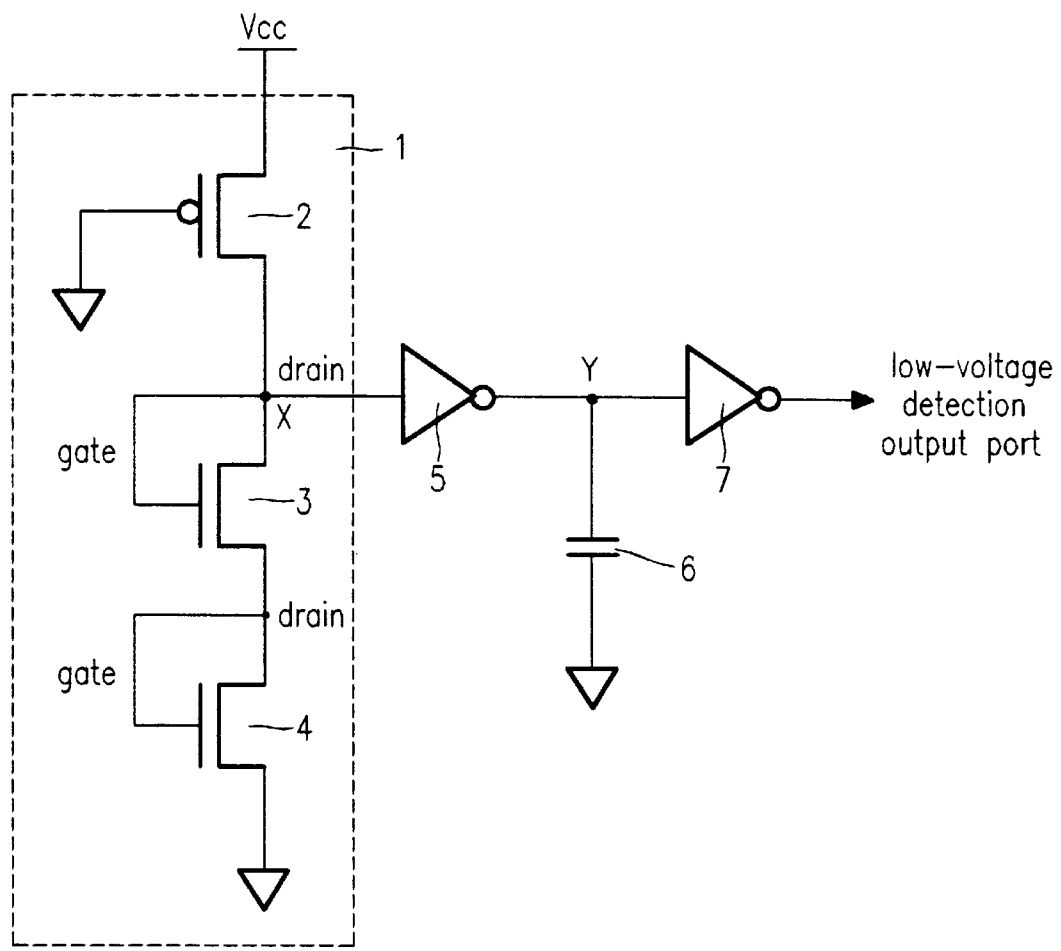
FIG. 1 is a circuit diagram of a conventional low-voltage detecting circuit.
Figure 3A:
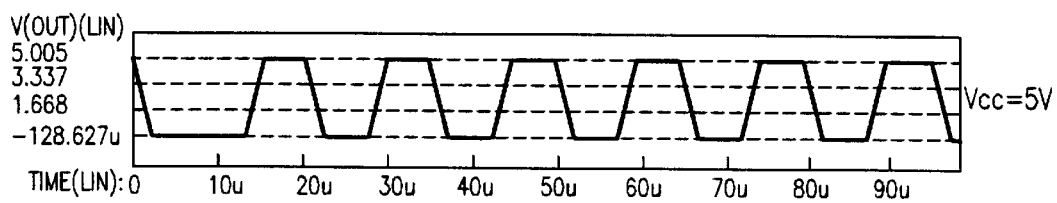
FIGS. 3A–3D depict waveforms output by an oscillator of the low-voltage detecting circuit in accordance with the present invention.
Figure 3B:
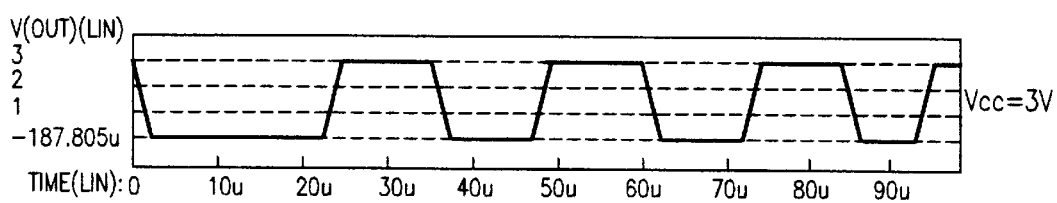
Figure 3C:
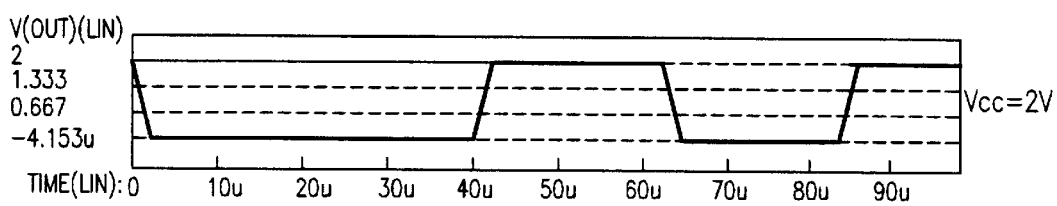
Figure 3D:
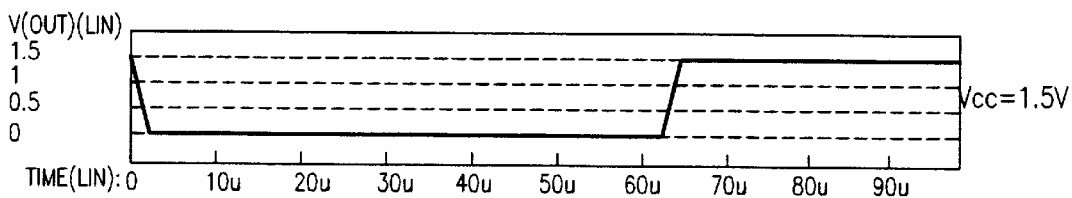

FIG. 2 is a circuit diagram of a low-voltage detecting circuit in accordance with the embodiments of the present invention, and FIGS. 3A–3D depict waveform outputs of an oscillator of the low-voltage detecting circuit in accordance with the present invention.

As shown in FIG. 2, the low-voltage detecting circuit is realized through an oscillator 20 which outputs a waveform according to a variation in the transconductance of transistors, and a low-voltage detecting signal generator 19 which generates a low-voltage detecting signal in response to the output of the oscillator 20.

The oscillator 20 includes a first P-type metal oxide semiconductor (PMOS) transistor 21 having one electrode connected to a supply voltage Vcc; a second PMOS transistor 22 connected in series with another electrode of the first PMOS transistor 21 and having a gate electrode for receiving a control signal from a micro-controller unit (MCU); a first N-type metal oxide semiconductor (NMOS) transistor 23 having one electrode connected in common with the second PMOS transistor 22 at output terminal A, another electrode grounded, and a gate electrode to which the control signal from the MCU is input; a second NMOS transistor 24 connected in parallel with the first NMOS transistor 23 at the output terminal A, and having a gate electrode connected to the gate electrode of the first PMOS transistor 21 and another electrode grounded; a capacitor 26 having one electrode coupled to the output terminal A and the second NMOS transistor 24, and the other electrode grounded; a schmitt trigger 25 connected to the output terminal A for rectifying a signal at the output terminal A according to discharging/charging of the capacitor 26 to generate a waveform, e.g., a rectangular waveform; and a latch 27 which stores the output of the Schmitt trigger 25 and outputs the stored output; and an inverter 28 which inverts the output of the latch 27. The output of the latch 27 is fed back to the gate electrode of the first PMOS transistor 21 and the gate electrode of the second NMOS transistor 24.

The output of latch 27 is input to the low-voltage detecting signal generator 19. The low-voltage detecting signal generator 19 includes a counter register 29 which counts the number of cycles in the waveform output by the oscillator 20 and stores the count value; a falling edge (FE) detecting section 30 which detects a falling edge of the control signal output from the MCU and produces a clear signal to the counter register 29 based on the detection; a rising edge (RE) detecting section 31 which detects a rising edge of the control signal and generates an output enable signal to the counter register 29 based on the detection; a reference register 33 which stores a prescribed reference value input through a data bus line; and a comparator 32 which compares the output of the counter register 29 with that of the reference register 33 to generate a low-voltage detecting signal at a low-voltage detection output port.

The following description relates to the operation of the low-voltage detecting circuit according to the embodiments of the present invention.

When the control signal from the MCU is at a high level, the output generated at node D remains constant so that the counter register 29 does not increase the count number. When the control signal transits to a low level (i.e., at the falling edge of the control signal), the counter register 29 is cleared. At the same time, the oscillator 20 begins to generate an oscillating signal according to the level of the supply voltage Vcc. The oscillating signal is continuously generated as long as the control signal is maintained at the low level. When the control signal transits from low to high (i.e., at the rising edge), the count value of counter register 29 is output to the comparator 32 and the generation of the oscillating signal is stopped.

More particularly, when the MCU control signal is at a high level, the first NMOS transistor 23 is turned on and the second PMOS transistor 22 is turned off to cause the potential at the output terminal A to be low. The charge of the capacitor 26 is discharged through the first NMOS 23 transistor. The schmitt trigger 27 outputs a high level signal to the input terminal B of the latch 27. The high level signal is changed to a low level signal by the latch 27 so that the potential at the input terminal C is low. The low potential value at the input terminal C is fed back to turn on the first PMOS transistor 21 and to turn off the second NMOS transistor 24. The potential at node D at this time is high.

When the second PMOS transistor 22 is turned off, the supply voltage Vcc is not applied to the capacitor 26. This maintains the high potential at node D. Then the count value of the counter register 29 is not increased since no oscillating signal is generated.

On the other hand, when the control signal transits from high to low, the FE detecting section 30 detects a falling edge of the control signal and generates a clear signal to clear the counter register 29. As the control signal is maintained at the low level, the latch 27 outputs a low level signal which is fed back to turn on the first PMOS transistor 21. At the same time, the second PMOS transistor 22 is turned on and the second NMOS transistor 24 is turned off by the control signal of the MCU. The supply voltage Vcc is then applied to the capacitor 26.

When the potential of the charged capacitor 26 is higher than a logic threshold value of the schmitt trigger 25, the potential at the input terminal B of the latch 27 is low, and the potential at the input terminal C is high. The high potential at the input terminal C turns off the first PMOS transistor 21 so that the capacitor 26 is not charged. The second NMOS transistor 24 is turned on because the capacitor 26 is not charged. The charge of the capacitor 26 is then discharged through the ground GND.

When the charge of the capacitor 26 is lower than the logic threshold value of the schmitt trigger 25, the potential at the input terminal B is high so that the potential at the input terminal C becomes low. This turns on the first PMOS transistor 21 while turning off the second NMOS transistor 24. The supply voltage Vcc is applied to the capacitor 26 and the capacitor 26 is recharged. The charging and discharging of the capacitor 26 produces an oscillating signal (e.g., a rectangular waveform) at node D.

The rectangular waveform output from the oscillator 20 is input to the counter register 29 as a clock signal. The number of rectangular waves (e.g., number of cycles) present in the waveform is counted by the counter register 29.

When the control signal transits from low to high (i.e., at the rising edge), the RE detecting section 31 detects a rising edge of the control signal and generates an output enable signal to the counter register 29. At the same time, generation of the rectangular waveform by the oscillator 20 is stopped.

Upon receipt of the output enable signal, the counter register 29 outputs the count value to the comparator 32. The comparator 32 receives a predetermined reference value from the reference register 33. The reference register 33 receives and stores the predetermined reference value through a data bus line. The comparator 32 compares the predetermined reference value with the count value output by the counter register 29. If the count value is less than the reference value, a "high" low-level voltage detecting signal is produced at the low-voltage detecting output port. If the count value is greater than the reference value, a "low" low-voltage detecting signal is produced at the output port. The "high" detecting signal indicates that the supply voltage level is lower than a desired voltage level and detects a voltage drop in the system. The "low" detecting signal indicates no low voltage or voltage drop in the system.

FIGS. 3A–3D depict waveforms output from the oscillator 20 at the terminal C shown in FIG. 2. As shown in FIGS. 3A–3D, as the supply voltage Vcc is increased, the number of waves present in the waveform during a preset time period is increased. The preset time period is controlled by the MCU control signal. That is, if the supply voltage Vcc is low, a low number of waves (i.e. low in frequency) will be detected. In which case, a "high" low-voltage detecting signal will be generated indicating that the supply voltage Vcc is low. If the supply voltage Vcc is high, the comparator 32 will generate a "low" low-voltage detecting signal indicating that the supply voltage Vcc is not low.

According to the above device and method for detecting a low voltage in a system, a drop in the number of rectangular waves detected indicates a voltage drop in the supply voltage Vcc.

Further, the reference value stored in the reference register 33 can be varied (i.e., a desired reference voltage can be set without a limit to a predetermined level of voltage). Therefore, the present low-voltage detecting circuit and detecting method are readily applicable to various electronic systems.

Moreover, the low-voltage detection according to the present invention is performed using the transconductance of the transistors which varies according to the level of a supply voltage (or applied voltage). The present low-voltage detection is not influenced by variable factors, such as the threshold voltage variation present during fabrication. Temporary supply voltage variations do not activate the present low-voltage detecting circuit so that malfunctions in the low-voltage detecting circuit and failures in the overall system are prevented.

Accordingly, the low-voltage detecting circuit and method of detecting a low voltage using the low-voltage detecting circuit of the present invention are reliable as a low-voltage detection system for various electronic and optical systems. The present invention can preclude standby currents and increase the life of a dry cell if used in the systems.

It will be apparent to those skilled in the art that various modifications and variations can be made in the electric heating mattress of the present invention without departing from the spirit or scope of the invention. Thus, it is intended that the present invention cover the modifications and variations of this invention provided they come within the scope of the appended claims and their equivalents.

What is claimed is:

1. A low-voltage detecting circuit comprising:

oscillating means for generating a waveform proportional to a supply voltage according to a control signal input thereto; and low-voltage detecting signal generating means for generating a detection signal based on the waveform generated by said oscillating means for indicating when the supply voltage is low.

2. A low-voltage detecting circuit as set forth in claim 1, wherein said low-voltage detecting signal generating means counts a number of waves present in the generated waveform, compares the count value with a reference value, and outputs the detection signal based on the comparison result.

3. A low-voltage detecting circuit as set forth in claim 2, wherein said oscillating means includes:

a first transistor having one electrode connected to the supply voltage, a second transistor coupled in series with said first transistor, a third transistor having one electrode connected to said second transistor and another electrode connected to a ground, and a fourth transistor having one electrode coupled with said third transistor, and another electrode connected to the ground.

4. A low-voltage detecting circuit as set forth in claim 2, wherein the waveform includes substantially rectangular waves.

5. A low-voltage detecting circuit as set forth in claim 1, wherein said oscillating means includes:

a first P-type metal oxide semiconductor (PMOS) transistor having one electrode connected to the supply voltage, and a second PMOS transistor coupled in series with said first PMOS transistor.

6. A low-voltage detecting circuit as set forth in claim 5, wherein said oscillating means further includes:

a first N-type metal oxide semiconductor (NMOS) transistor having one electrode connected to said second PMOS transistor at a first terminal and another electrode connected to a ground, and a second NMOS transistor having one electrode coupled with said first NMOS transistor at said first terminal, and another electrode connected to the ground.

7. A low-voltage detecting circuit as set forth in claim 6, wherein said oscillating means further includes:

a capacitor connected to said first terminal and said second NMOS transistor, a schmitt trigger connected to said first terminal for rectifying a signal shaped by said capacitor, latching means for storing an output of said schmitt trigger, and inverter means for inverting an output of said latching means.

8. A low-voltage detecting circuit as set forth in claim 7, wherein the output of said latching means is fed back to each gate electrode of said first PMOS and second NMOS transistors.

9. A low-voltage detecting circuit as set forth in claim 6, wherein the control signal is generated by a micro-controller unit and input to gate electrodes of said first NMOS and second PMOS transistors.

10. A low-voltage detecting circuit as set forth in claim 6, wherein a gate electrode of said second NMOS transistor is coupled in common with a gate electrode of said first PMOS transistor.

11. A low-voltage detecting circuit as set forth in claim 1, wherein said low-voltage detecting signal generating means includes:

a counter register circuit for counting a number of waves present in the generated waveform, storing means for storing a predetermined reference value, and comparator means for comparing the count value with the predetermined reference value and generating the detecting signal based on the comparison result.

12. A low-voltage detecting circuit as set forth in claim 11, wherein said storing means includes a reference register for storing the predetermined reference value, the predetermined reference value being input to the reference register through a data bus line.

13. A low-voltage detecting circuit as set forth in claim 11, wherein said low-voltage detecting signal generating means includes:

falling edge detection means for detecting a falling edges of the control signal and clearing said counter register circuit based on the falling edge detection result.

14. A low-voltage detecting circuit as set forth in claim 11, wherein said low-voltage detecting signal generating means includes:

rising edge detection means for detecting a rising edge of the control signal and generating an output enable signal to said counter register circuit based on the rising edge detection result.

15. A low-voltage detecting circuit as set forth in claim 1, wherein when the control signal is at a low level, said oscillating means generates the waveform corresponding to a level of the supply voltage.

16. A low-voltage detecting circuit as set forth in claim 15, wherein when the control signal transits from the low level to a high level, said oscillating means stops generating the waveform.

17. A low-voltage detecting circuit as set forth in claim 1, wherein a number of waves present in the waveform is decreased as the supply voltage is decreased.

18. A low-voltage detecting circuit as set forth in claim 1, wherein a number of waves present in the waveform is increased as the supply voltage is increased.

19. A low-voltage detecting circuit as set forth in claim 1, wherein said oscillating means includes a plurality of transistors, a schmitt trigger, a latch circuit, a capacitor and an inverter connected to said low-voltage detecting signal generating means, for generating the waveform corresponding to the supply voltage.

20. A method of detecting a low voltage in a system comprising the steps of:

generating a waveform proportional to a supply voltage according to a control signal generated by a control unit;

counting a number of waves present in the waveform;

comparing the count value with a reference value; and outputting a detection signal based on the comparison result for indicating when the supply voltage is low.

21. A method as set forth in claim 20, wherein said generating step includes the steps of:

connecting one electrode of a first P-type metal oxide semiconductor (PMOS) transistor to the supply voltage; and coupling in series a second PMOS transistor with the first PMOS transistor.

22. A method as set forth in claim 21, wherein said generating step further includes the steps of:

connecting one electrode of a first N-type metal oxide semiconductor (NMOS) transistor to the second PMOS transistor at a first terminal, and connecting another electrode of the first NMOS transistor to a ground; and coupling one electrode of a second NMOS transistor with the first NMOS transistor at said first terminal, and connecting another electrode of the second NMOS transistor to the ground.

23. A method as set forth in claim 22, wherein said generating step further includes the steps of:

connecting a capacitor to said first terminal and the second NMOS transistor;

rectifying a signal shaped by the capacitor;

latching the rectified signal; and inverting the latched signal to generate the waveform which corresponds to the supply voltage.

24. A method as set forth in claim 23, wherein said generating step includes the step of:

feeding back the latched signal to gate electrodes of the first PMOS and second NMOS transistors.

25. A method as set forth in claim 22, wherein said generating step includes the step of:

inputting the control signal to gates of the second PMOS transistor and the first NMOS transistor to selectively activate the second PMOS transistor and the first NMOS transistor.

26. A method as set forth in claim 20, wherein said counting step includes the steps of:

detecting a falling edge of the control signal and clearing the count value based on the falling edge detection result; and detecting a rising edge of the control signal and enabling output of the count value based on the rising edge detection result.

27. A method as set forth in claim 20, wherein a number of waves present in the waveform is decreased as the supply voltage is decreased.

28. A method as set forth in claim 20, wherein a number of waves present in the waveform is increased as the supply voltage is increased.

* * * * *